United States Patent
Sugiura

(10) Patent No.: US 9,748,946 B2
(45) Date of Patent: Aug. 29, 2017

(54) POWER SUPPLY SWITCHING CIRCUIT AND SEMICONDUCTOR DEVICE

(71) Applicant: SII Semiconductor Corporation, Chiba-shi, Chiba (JP)

(72) Inventor: Masakazu Sugiura, Chiba (JP)

(73) Assignee: SII SEMICONDUCTOR CORPORATION, Chiba-Shi, Chiba (JP)

(*) Notice: Subject to any disclaimer, the term of this patent is extended or adjusted under 35 U.S.C. 154(b) by 0 days.

(21) Appl. No.: 15/015,526

(22) Filed: Feb. 4, 2016

(65) Prior Publication Data
US 2016/0233773 A1    Aug. 11, 2016

(30) Foreign Application Priority Data
Feb. 9, 2015    (JP) ................ 2015-023426

(51) Int. Cl.
B23K 11/24    (2006.01)
H03K 17/30    (2006.01)

(52) U.S. Cl.
CPC ....... *H03K 17/30* (2013.01); *H03K 2017/307* (2013.01)

(58) Field of Classification Search
CPC .................. H02M 3/158; H03K 17/30
See application file for complete search history.

(56) References Cited

U.S. PATENT DOCUMENTS 5,764,032 A * 6/1998 Moore ............... H02J 7/0024
                                                    307/66
2008/0048500 A1* 2/2008 Kihara ................ H02J 1/06
                                                    307/80

FOREIGN PATENT DOCUMENTS

JP    2003-087994 A    3/2003

* cited by examiner

*Primary Examiner* — Daniel Cavallari
(74) *Attorney, Agent, or Firm* — Brinks Gilson & Lione

(57) ABSTRACT

To provide a power supply switching circuit which avoids an increase in current consumption. A power supply switching circuit includes MOS transistors provided between power supply input terminals and an output terminal, which have gates connected to each other and backgates connected to each other and are connected in series.

3 Claims, 4 Drawing Sheets

US 9,748,946 B2

POWER SUPPLY SWITCHING CIRCUIT AND SEMICONDUCTOR DEVICE

RELATED APPLICATIONS

This application claims priority under 35 U.S.C. §119 to Japanese Patent Application No. 2015-023426 filed on Feb. 9, 2015, the entire content of which is hereby incorporated by reference.

BACKGROUND OF THE INVENTION

Field of the Invention

The present invention relates to a power supply switching circuit which is suitable for use in a semiconductor device supplied with power from a main power supply and a sub power supply, and which switches the supply of power from the main power supply to the sub power supply when the supply of the power from the main power supply is stopped.

Background Art

FIG. 3 is a circuit diagram illustrating a related art power supply switching circuit.

The related art power supply switching circuit is equipped with a main power supply input terminal 200 supplied with a voltage V0 of a main power supply, a sub power supply input terminal 201 supplied with a voltage V1 of a sub power supply, PN junction elements 202 and 203, and an output terminal 204 which outputs a voltage Vout.

FIG. 4 is a sectional structure diagram of a PN junction element of a related art power supply switching circuit.

The PN junction element is realized by defining an N-type region 208 provided in a P-type region 209 of a substrate as a cathode terminal 206 and defining a P-type region 207 provided in the N-type region 208 as an anode terminal 205. Incidentally, the P-type region 209 of the substrate is supplied with the lowest voltage (VSS) to avoid the flow of an extra forward bias current between the P-type region 209 thereof and the N-type region adjacent to the P-type region 209.

The related art power supply switching circuit is intended to achieve the stable supply of power to a semiconductor device by supplying power from the sub power supply in a backup operating state in which power from the main power supply is stopped.

[Patent Document 1] Japanese Patent Application Laid-Open No. 2003-87994

SUMMARY OF THE INVENTION

The related art power supply switching circuit is however accompanied by a problem that since a PN junction element forward-biased in a path supplied with power when the power is supplied exists, a collector current flows into a parasitic PNP type bipolar element, thereby increasing current consumption.

The present invention has been invented to solve the foregoing problem and provides a power supply switching circuit low in current consumption.

In order to solve the related art problem, the power supply switching circuit of the present invention is configured as follows:

The power supply switching circuit is provided which switches power supplies of a semiconductor device supplied with power from a plurality of power supply input terminals and outputs the switched power supply to an output terminal, and which includes MOS transistors between the power supply input terminals and the output terminal, which have gates connected to each other and backgates connected to each other and are connected in series.

According to the power supply switching circuit of the present invention, it is possible to provide a power supply switching circuit low in current consumption.

DETAILED DESCRIPTION OF THE PREFERRED EMBODIMENTS

A power supply switching circuit of the present embodiment will hereinafter be described with reference to the accompanying drawings.

Figure 1:
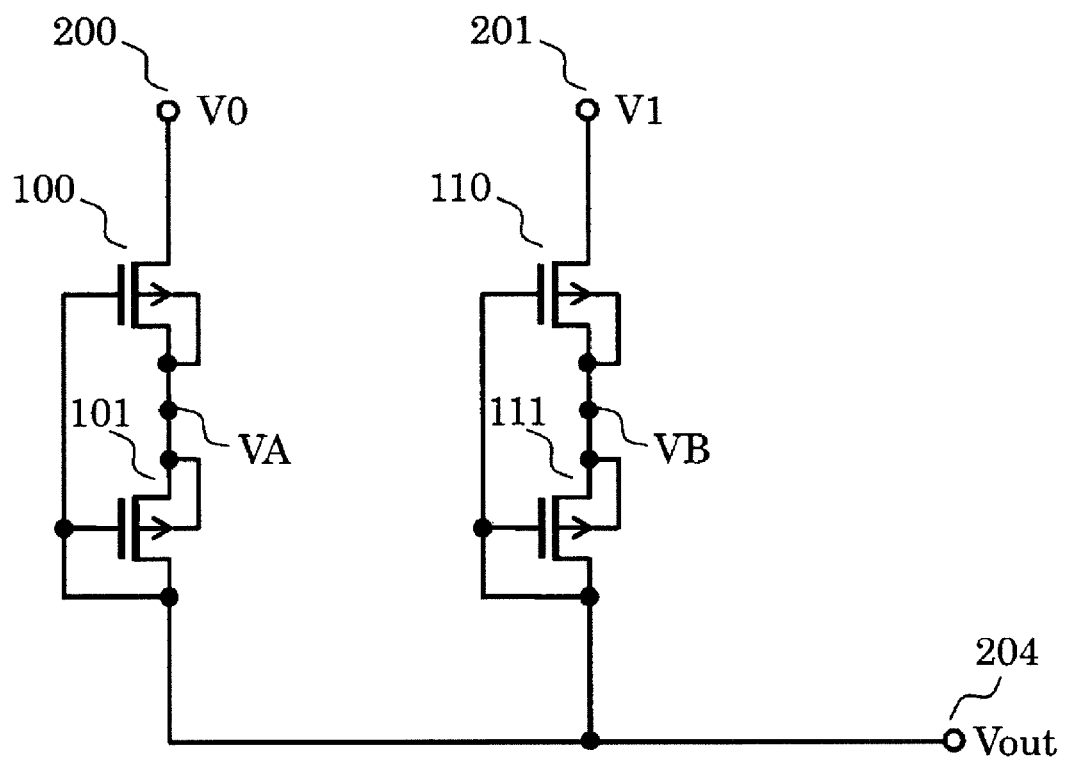
FIG. 1 is a circuit diagram illustrating a power supply switching circuit of the present embodiment.
Figure 2:
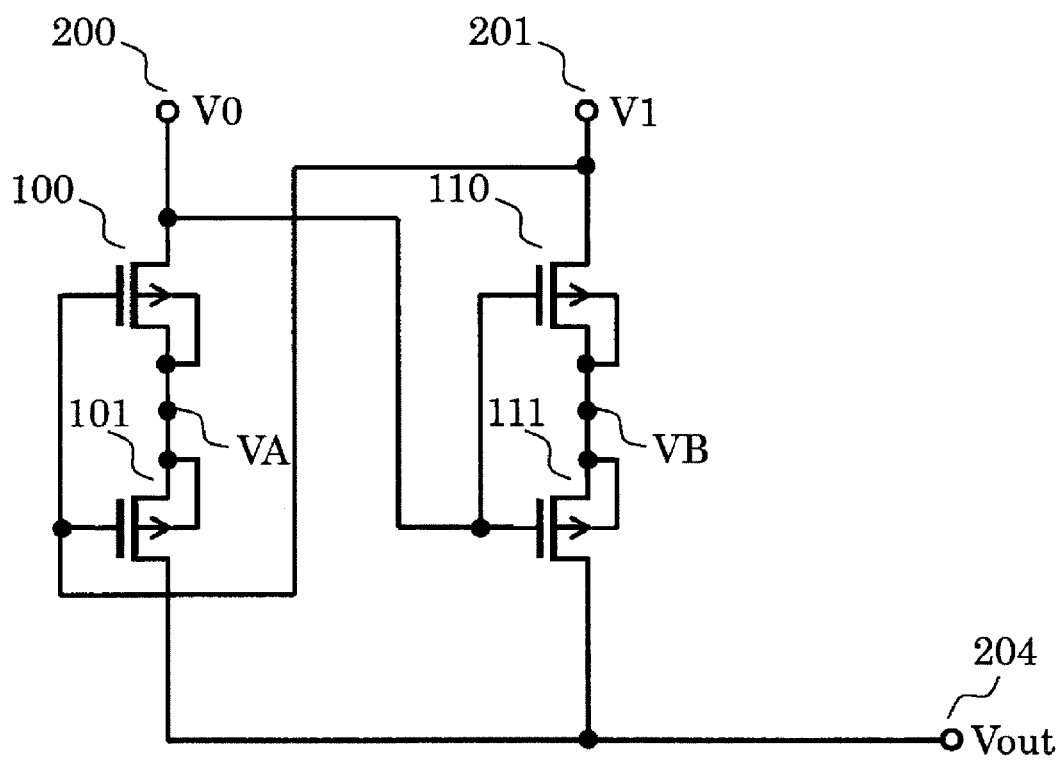
FIG. 2 is a circuit diagram illustrating another example of the power supply switching circuit of the present embodiment.
Figure 3:
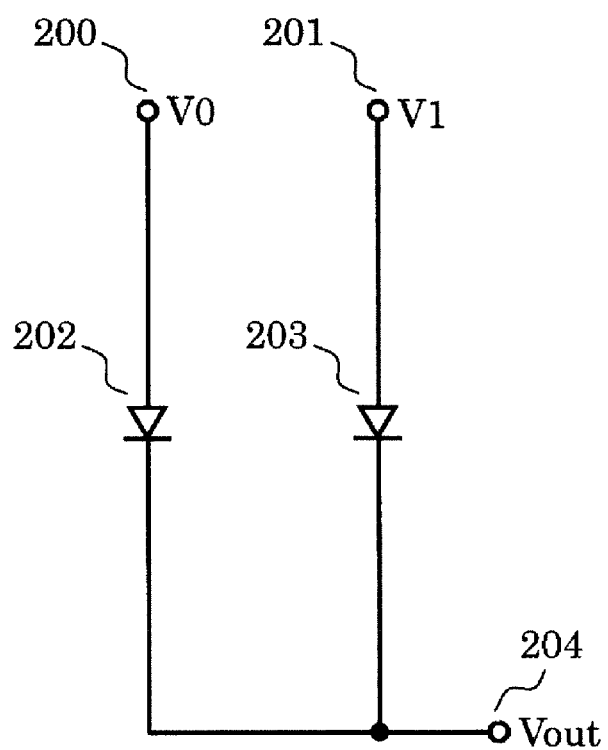
FIG. 3 is a circuit diagram illustrating a related art power supply switching circuit.

FIG. 1 is a circuit diagram illustrating a power supply switching circuit of the present embodiment.

The power supply switching circuit of the present embodiment is equipped with a main power supply input terminal 200 supplied with a voltage V0 of a main power supply, a sub power supply input terminal 201 supplied with a voltage V1 of a sub power supply, MOS transistors 100, 101, 110 and 111, and an output terminal 204 which outputs a voltage Vout.

The MOS transistor 100 has a drain connected to the main power supply input terminal 200, and a source and a backgate connected to each other. The MOS transistor 101 has a gate and a drain connected to a gate of the MOS transistor 100 and the output terminal 204, and a source and a backgate connected to the source and backgate of the MOS transistor 100. The MOS transistor 110 has a drain connected to the sub power supply input terminal 201, and a source and a backgate connected to each other. The MOS transistor 111 has a gate and a drain connected to a gate of the MOS transistor 110 and the output terminal 204, and a source and a backgate connected to the source and backgate of the MOS transistor 110.

The operation of the power supply switching circuit of the present embodiment will next be described.

Since the MOS transistor 100 is brought to an on state in a normal operating state in which the voltage V0 is higher than the voltage V1, a drain voltage VA becomes substantially equal to the voltage V0. Since a source voltage (voltage VA) is substantially equal to the voltage V0, the MOS transistor 101 is brought to an on state, so that the voltage V0 of the main power supply is supplied to the output terminal 204.

Here, since V0≈VA, no forward bias voltage is applied to a PN junction element between the drain and backgate of the MOS transistor 100. Thus, since a PNP type bipolar element in which the PN junction element between the drain and backgate of the MOS transistor 100 is assumed to be an emitter and a base, and a P region 209 of a substrate is assumed to be a collector, is not turned on, no collector current flows. Thus, an increase in current consumption of the power supply switching circuit does not occur.

On the other hand, since in a path of the sub power supply, the MOS transistor 110 has a gate voltage being apparently higher than a source voltage, and a PN junction element between the drain and backgate of the MOS transistor 110 is apparently reverse-biased, no current flows into the MOS transistor 110. Thus, it becomes possible to suppress inflow current into the sub power supply input terminal 201, i.e., the sub power supply.

Since the MOS transistor 110 is brought to an on state in a backup operating state in which the voltage V0 is lower than the voltage V1, a drain voltage VB becomes substantially equal to the voltage V1. The MOS transistor 111 is brought to an on state because a source voltage (voltage VB) is substantially equal to the voltage V1, so that the output terminal 204 is supplied with the voltage V1 of the sub power supply.

Here, since V0≈VA, no forward bias voltage is applied to the PN junction element between the drain and backgate of the MOS transistor 110. Thus, since a PNP type bipolar element in which the PN junction element between the drain and backgate of the MOS transistor 110 is assumed to be an emitter and a base, and the P region 209 of the substrate is assumed to be a collector, is not turned on, no collector current flows. Thus, an increase in current consumption of the power supply switching circuit does not occur.

On the other hand, since in a path of the main power supply, the MOS transistor 100 has a gate voltage being apparently higher than a source voltage, and the PN junction element between the drain and backgate of the MOS transistor 100 is apparently reverse-biased, no current flows into the MOS transistor 100. Thus, it becomes possible to suppress inflow current into the main power supply input terminal 200, i.e., the main power supply.

According to the power supply switching circuit of the present embodiment, as described above, it is possible to provide a power supply switching circuit low in current consumption. Further, there is provided a power supply switching circuit which takes into consideration even the suppression of inflow current into each power supply.

Incidentally, although the circuit of FIG. 1 has been described in the above by way of example under the presumption that it is the power supply switching circuit for the main power supply and the sub power supply, it is possible to obtain an effect similarly even with respect to three or more power supplies. For example, as with the MOS transistors 100 and 101 for the main power supply, transistors may similarly be provided in other power supplies.

Figure 4:
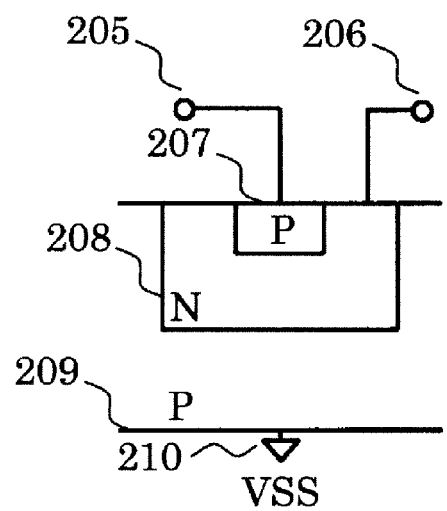
FIG. 4 is a sectional structure diagram of a PN junction element of a related art power supply switching circuit.

Further, although the gate voltage of each transistor has been described as being supplied by the output terminal 204 of the power supply switching circuit, the gate of the transistor in the path which supplies power may be supplied with a voltage lower than the output of the power supply switching circuit, and the gate of the transistor in the path which does not supply power may be supplied with a voltage higher than the output of the power supply switching circuit. As illustrated in FIG. 4, for example, the gate of the transistor may be connected to the other input terminal.

What is claimed is:

1. A power supply switching circuit which switches power supplies of a semiconductor device supplied with the power supplies to a plurality of power supply input terminals and outputs the switched power supply to an output terminal, comprising:
respective MOS transistors provided between the power supply input terminals and the output terminal, said respective MOS transistors connected to an input terminal of each respective power supply having gates directly connected to each other, and backgates connected to each other and being connected in series, respectively, and the gate of each of the respective MOS transistors is directly connected to the output terminal.

2. The power supply switching circuit according to claim 1, wherein the gate of the respective MOS transistor is connected to input terminal of another power supply.

3. A semiconductor device equipped with the power supply switching circuit according to claim 1.

* * * * *